United States Patent [19]

Boucharlat et al.

[11] Patent Number: 4,819,072
[45] Date of Patent: Apr. 4, 1989

[54] ANTI DAZZLE DEVICE FOR A CHARGE TRANSFER IMAGE SENSOR AND AN IMAGE SENSOR INCLUDING SUCH A DEVICE

[75] Inventors: Gilles Boucharlat; Yvon Cazaux, both of Grenoble; Jean-Joseph Chabbal, Saint Egreve, all of France

[73] Assignee: Thomson-CSF, Paris, France

[21] Appl. No.: 132,332

[22] Filed: Dec. 14, 1987

[30] Foreign Application Priority Data

Dec. 16, 1986 [FR] France ................. 86 17572

[51] Int. Cl.$^4$ ............................................. H04N 3/14
[52] U.S. Cl. ........................... 358/213.29; 358/213.26; 357/24
[58] Field of Search ............... 358/213.19, 213.15, 358/213.26, 213.29, 212; 357/24 LR

[56] References Cited

U.S. PATENT DOCUMENTS

| 4,336,557 | 6/1982 | Koch | 358/213.15 |
| 4,430,672 | 2/1984 | Berger | 358/213.19 |
| 4,611,234 | 9/1986 | Berger et al. | 358/213.15 |
| 4,645,938 | 2/1987 | Brissot et al. | 358/213.12 |
| 4,654,713 | 3/1987 | Boucharlat et al. | 358/213.31 |
| 4,680,476 | 7/1987 | Berger et al. | 358/213.26 |
| 4,684,993 | 8/1987 | Berger et al. | 358/213.29 |
| 4,694,316 | 9/1987 | Chabbal | 357/24 LR |
| 4,695,890 | 9/1987 | Boucharlat et al. | 358/213.31 |
| 4,737,841 | 4/1988 | Kinoshita et al. | 358/213.29 |

FOREIGN PATENT DOCUMENTS 0083376  7/1983  European Pat. Off. .

OTHER PUBLICATIONS

Patent Abstracts of Japan, vol. 8, No. 74 (E-236), [1511], 6 Avril 1984; & JP-A-58 220 573 (Olympus Kogaku Kogyo K.K.), 22-12-1983.
Patent Abstracts of Japan, vol. 6, No. 87 (#-108), [965], 25 Mai 1982; & JP-A-57 21 878 (Nippon Denki K.K.), 04-02-1982.

Primary Examiner—Jin F. Ng
Assistant Examiner—Stephen Brinich
Attorney, Agent, or Firm—Oblon, Fisher, Spivak, McClelland & Maier

[57] ABSTRACT

An antidazzle image sensor having an assembly of photosensitive elements in which charges are released by light and antidazzle drains coupled respectively to each one of the photosensitive elements for draining away excess charges released during a phase in which charges are accumulated in the photosensitive elements. At least one charge transfer reading register, which is coupled to each photosensitive element assembly, is used so that the charges released in each photosensitive element assembly are transferred to the charge transfer reading register and subsequently shifted by this register to a series output. An auxiliary register is used in order to collect excess charges which are released by light during the time when charges are being transferred from the photosensitive elements to the reading register. The auxiliary register also functions to shift these transfer charges towards a drain.

4 Claims, 4 Drawing Sheets

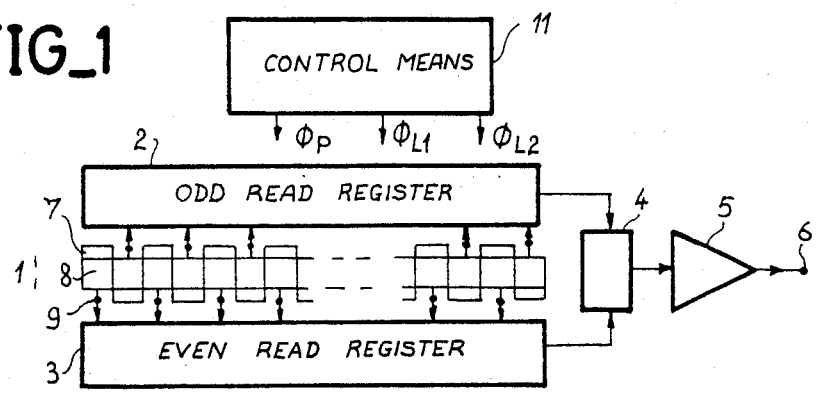
FIG_1
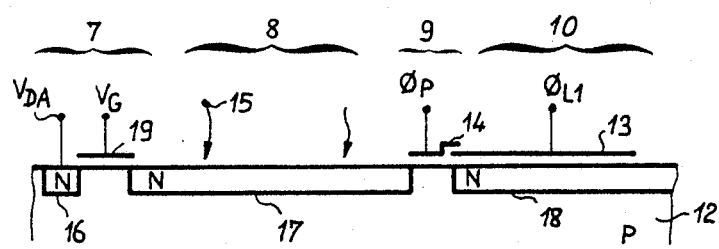
FIG_2a
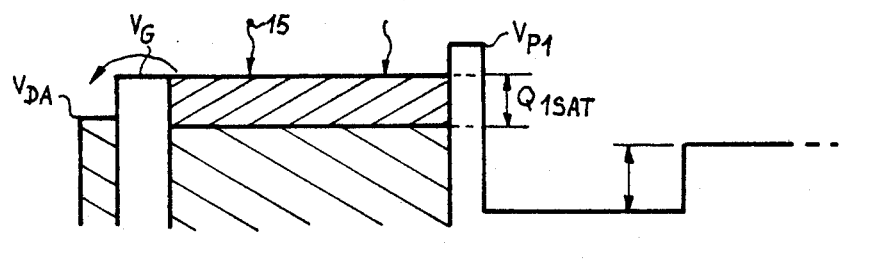
FIG_2b
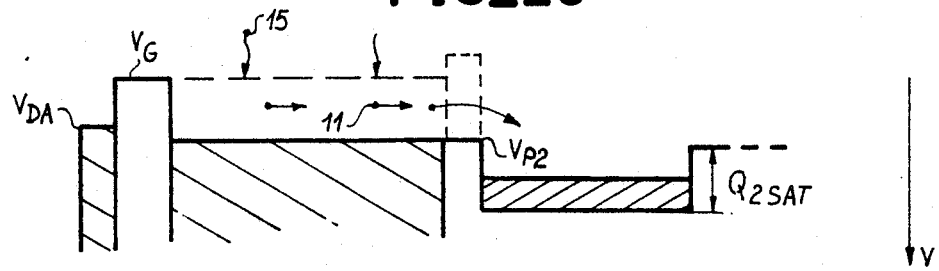
FIG_2c

FIG_3
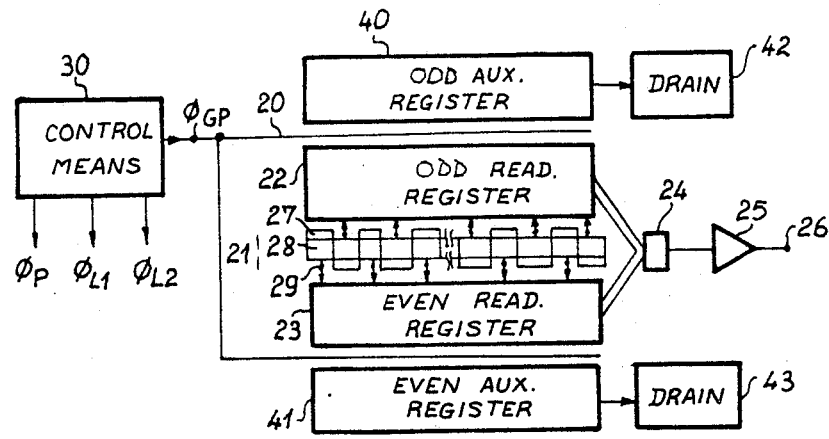
FIG_4a
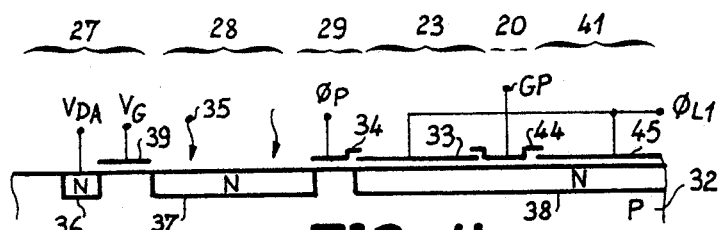
FIG_4b
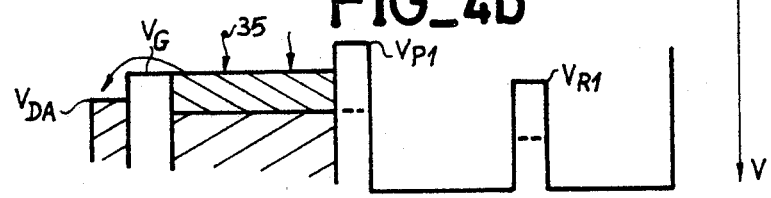
FIG_4c
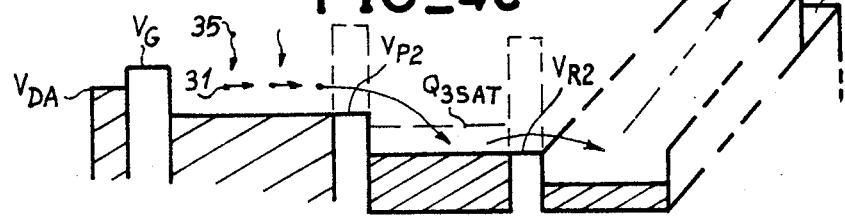

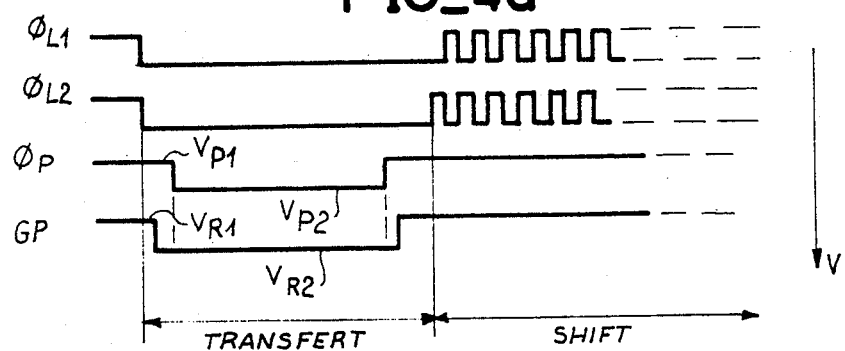
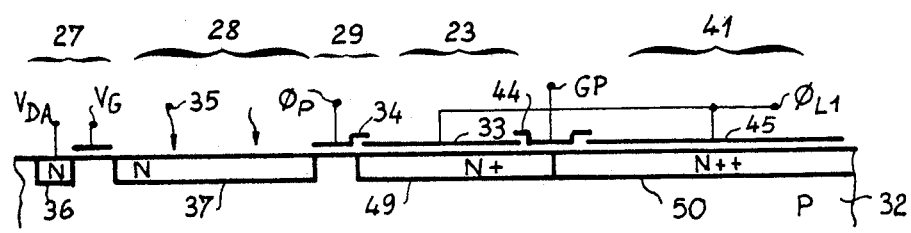
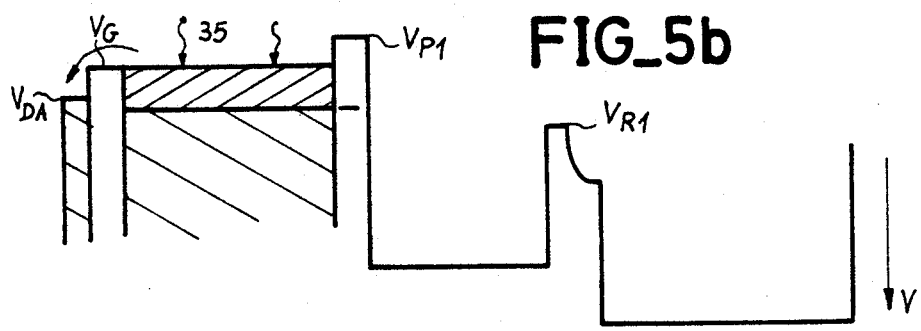
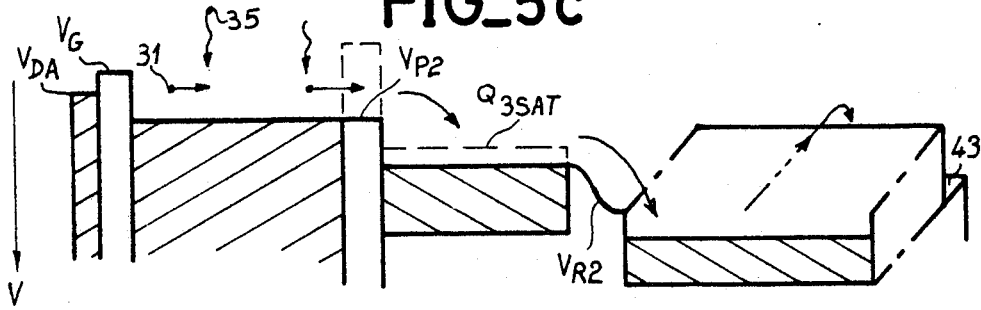

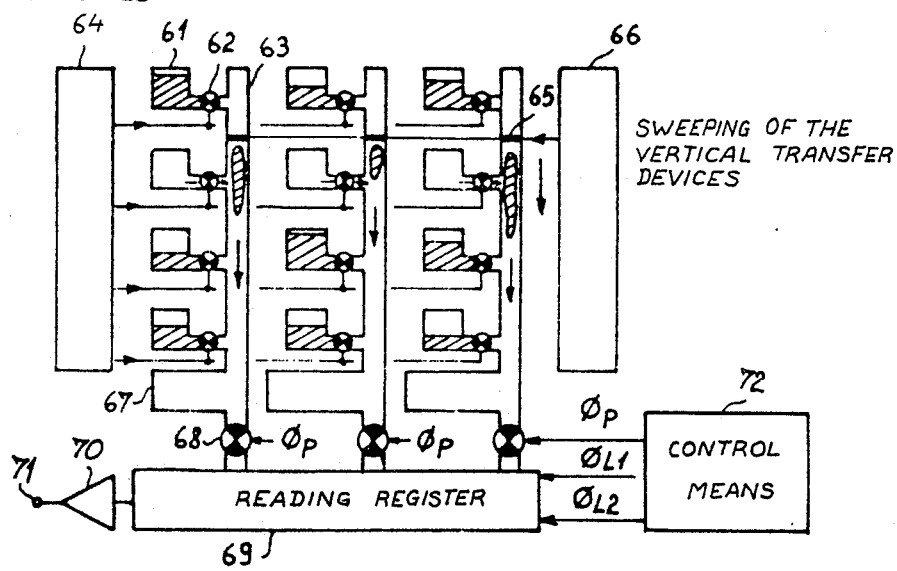
FIG_6
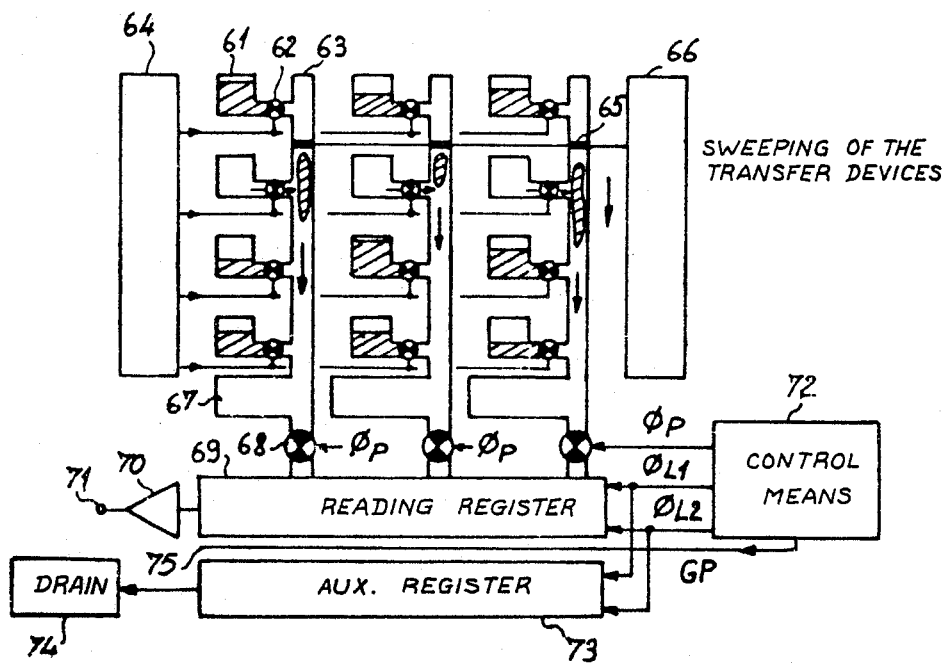
FIG_7

ANTI DAZZLE DEVICE FOR A CHARGE TRANSFER IMAGE SENSOR AND AN IMAGE SENSOR INCLUDING SUCH A DEVICE

BACKGROUND OF THE INVENTION

The invention relates to an antidazzle device for charge transfer image sensors, such as those used in television cameras. In such an image sensor, a row or matrix of photosensitive elements receives light bearing an image. This light releases charges in each photosensitive element proportionally to the amount of light received by this element. These charges are accumulated in the photosensitive elements during a so called accumulation phase, then are transferred to a charge transfer register, called reading register, during a so called reading phase. The charges accumulated by a row of photosensitive elements are transferred in parallel into the reading register, then are restored sequentially; the role of the reading register being to shift the charge packet corresponding to each photosensitive element towards a conversion capacity whose role is to deliver an electric voltage proportional to the amount of charges in each packet. This voltage is then amplified by a preamplifier whose output forms the output of the image sensor.

It frequently happens that an image includes over illuminated zones, because they represent a light source or an object reflecting a light source, situated in the picture taking field of the image sensor. The amount of charges released in the overilluminated photosensitive elements may saturate these elements in the reading register. The excess charges may overflow into adjacent photosensitive elements and the adjacent cells of the reading register. This phenomenon results in a halo or a light trail in the vicinity of the overilluminated points, called dazzle, in the image restored from the signal delivered by the image sensor.

It is not possible to avoid overillumination of certain photosensitive elements, without exaggeratedly reducing the illumination of the whole of the image sensor. To avoid the dazzle phenomenon of an image sensor, numerous devices, called antidazzle devices, have been designed. A first known type of device includes an antidazzle drain close to each photosensitive element and separated therefrom by a potential barrier whose algebraic value is greater than that of the potential barrier separating the photosensitive element from the reading register during the accumulation phase. Thus the drain removes the excess charges which could overflow from this photosensitive element during the accumulation phase, in the presence of overillumination.

A second known type of antidazzle device includes an antidazzle drain situated in depth under each photosensitive element. This drain is manufactured in accordance with the technique called buried layer or caisson technique. The operating principle is identical to that of the device of the first type.

Antidazzle drains are perfectly efficient during the charge accumulation time but are totally inoperative during the time for transferring the charges into the reading register, for the potential barrier defining each cell of the reading register has a level less than that of the potential barrier separating the photosensitive element from its antidazzle drain. The reading phase is of a much shorter duration than the accumulation phase, nevertheless high overillumination may cause cell saturation of the reading register. The efficiency of these two types of antidazzle device is therefore limited to moderate over illumination. It is not possible to simply reduce the generation of the reading phase to combat this dazzle phenomenon, for a reduction in this duration of the reading phase may cause an increase of the remanence phenomena, resulting in a degradation of the vertical modulation transfer function of the image sensor.

French patent application No. 2 538 200 describes an image sensor having a second type of antidazzle device, in which the duration of the reading phase is reduced without causing degradation of the vertical modulation transfer function by using a so called entraining charge, which is introduced into the reading register through a so called injection stage. The entraining charge is transferred to the cells of the reading register during the accumulation time of the charges released by the light and removal of the previously accumulated charges, then is transferred into the photosensitive element just before reading of the charges accumulated in this element. The charges released by the light and the entraining charge are then transferred together, from the photosensitive element to the cell of the reading register, during the reading phase whose duration is reduced.

The entraining charge has a constant value which, theoretically, does not disturb the value of the video signal delivered by the image sensor. However, the entraining charge adds a so called injection noise and a so called transfer noise to this video signal. The use of a volume transfer, rather than a surface transfer reading register does not increase the noise of the image sensor too much, however this noise is greater than that of a conventional image sensor. Furthermore, this device extends the limit of acceptable over-illumination without dazzle, but not sufficiently.

SUMMARY OF THE PRESENT INVENTION

The purpose of the invention is to overcome these two drawbacks using simple means.

The invention provides then an antidazzle device including conventional antidazzle drains for removing the excess charges released during the accumulation of rays; and further including an auxiliary register coupled to each reading register for collecting, transporting and finally removing into a drain the excess charges released during the transfer time of charges between an assembly of photosensitive elements and the reading register.

The antidazzle device according to the present invention operates for a charge transfer image sensor. The sensor includes at least one assembly of photosensitive elements in which charges are released by light and antidazzle drains coupled respectively to each photosensitive element for draining away any excess charges released during the phase where charges are accumulated in the photosensitive elements. The device also includes at least one charge transfer reading register which is coupled to each photosensitive element assembly. The charges which are released in the photosensitive element assembly are transferred to the charge transer reading register and then shifted by this register to a series output. The device further includes auxiliary registers which are each coupled to each one of the respective reading registers in order to collect excessive charges which are released by the light during the time when the charges are transferred from the photosensitive elements to the reading register. These auxiliary resistors then function to shift those charges toward a drain.

BRIEF DESCRIPTION OF THE DRAWINGS

The invention will be better understood and other details will be clear from the following description and accompanying Figures, in which:

FIG. 1 shows the block diagram of one embodiment of a known type of linear image sensor having a known antidazzle drain, coupled to each photosensitive element;

FIGS. 2a-2c illustrates the operation of this embodiment;

FIG. 3 shows a block diagram of one embodiment of an antidazzle device of the invention associated with this linear image sensor;

FIG. 4a shows a schematical section of this embodiment;

FIGS. 4b, 4c and 4d illustrates the operation of this embodiment during the accumulation phase and during the reading phase;

FIG. 5a shows the schematical section of a variant of this embodiment;

FIGS. 5b and 5c illustrate the operation of this variant, during the accumulation phase and during the reading phase;

FIG. 6 shows the block diagram of one embodiment of a matrix image sensor of known type; and FIG. 7 shows one embodiment of the anti-dazzle device of the invention associated with this matrix image sensor.

DETAILED DESCRIPTION OF THE INVENTION

FIG. 1 shows the block diagram of one embodiment of a known type linear image sensor having an anti-dazzle drain for each photosenstive element. This sensor includes: a row 1 of photosensitive elements 8; a so called uneven register 2 and a so called even register 3; a conversion capacity 4; a preamplifier 5; an output terminal 6 delivering a video signal; and control means 11.

Each photosensitive element 8 is associated with an anti-dazzle drain 7 and is connected, by a gate 9, to a cell of one of the reading registers 3 or 2. The photosensitive elements 8 having an even rank are connected to a cell of register 3 and the photosensitive elements 8 having an uneven rank are connected respectively to a cell of uneven reading register 2. Registers 2 and 3 each have a series output connected to the conversion capacity 4. This latter delivers a voltage to an input of the preamplifier 5, proportional to the amount of charges delivered by the output of one of registers 2 or 3. Gates 9 and the cells of registers 2 and 3 are controlled by electrode networks, not shown, connected to the control means 11 for receiving control signals $\phi_{L1}$, $\phi_{L2}$, $\phi_p$.

During the phase for the accumulation of charges which, in the case in point, are electrons, gates 9 are closed. During the reading phase, gates 9 are opened simultaneously by the control signal $\phi_p$, for transferring the charges contained in the photosensitive elements 8 to the cells of registers 2 and 3. Then these gates 9 are closed again and the registers are used as shift registers for transferring these charges to the capacity 4. Two control signals $\phi_{L1}$, $\phi_{L2}$, are applied to electrodes for shifting the charges contained in register 2 and the charges contained in register 3.

FIG. 2a shows a schematical cross section of this embodiment, showing a photosensitive element 8, and the antidazzle drain 7, gate 9 and a cell 10 of the reading register 3 associated with the photosensitive element 8. In this Figure, the insulating material situated under the electrodes is not shown for the sake of clarity. It is formed of silica. The photosensitive element 8 receives photons 15 and is formed by an N doped zone 17 implanted in a P type silicon substrate 12. The antidazzle drain 7 is formed by a MOS transistor having a gate 19, a drain 16 formed by an N doped implantation in the substrate and a source formed by the end of the N doped zone 17 of the photosensitive element 8. Gate 9 is brought to a constant potential $V_G$ and drain 16 is brought to a constant potential $V_{DA}$ higher than the potential of the channel existing under gate 19.

Gate circuit 9 is formed by a gate 14 over a substrate zone 12 which is without implantation in this example. In other embodiments, this zone of substrate 12 may include an N implantation without adversely affecting the operation. Gate 14 is controlled by the signal $\phi_P$ which may assume two potential values, $V_{P1}$ or $V_{P2}$. Cell 10 is formed by an N doped zone implanted in substrate 12, and by an electrode 13 over zone 18 and controlled by the signal $\phi_{L1}$ which may assume two potential values. Each cell of the reading registers 2 and 3 is separated from two adjacent cells by gates not shown, similar to gate 9 and controlled by the signal $\phi_{L2}$ which may assume two potential values. The potential of $\phi_{L1}$ and the potential of $\phi_{L2}$ change with a given phase shift for causing registers 2 and 3 to operate as shift registers, after the transfer of charges into these registers.

FIG. 2b shows a diagram of the potentials in the space of the section shown in FIG. 2a, during the charge accumulation phase. The potentials are referenced with respect to a vertical axis oriented from top to bottom. The charges released by the photons 15 accumulate in the channel defined by the potential barrier $V_G$ created by the electrode 19 and the potential barrier $V_{P2}$ created by electrode 14. This channel may collect at most an amount of charges $Q_{1SAT}$. If there is overillumination, the charges overflow from this channel by passing over barrier $V_G$ whose algebraic value is slightly greater than $V_{P1}$. Thus the charges overflow to the drain 16 without reaching the level $V_{P1}$ where they could overflow towards the reading register or towards the adjacent photosensitive elements, thus degrading the information contained in the reading register.

FIG. 2c shows a diagram of the potentials in the space of the section shown in FIG. 2a, during the reading phase. The potential barrier separating the photosensitive element 8 from cell 10 is lowered to a potential $V_{P2}$ whose algebraic value is greater than $V_{P1}$. The accumulated charges flow then towards cell 10 but they are accompanied by a charge supplement 11 created by the illumination during the reading phase. Each cell 10 is provided for connecting at most a charge $Q_{2SAT}$ which is greater than the maximum charge $Q_{1SAT}$ accumulable in a photosensitive element 8, however the additional charge amount released during the reading phase may be greater than the difference between $Q_{2SAT}$ and $Q_{1SAT}$.

In this case, the charges overflow from cell 10 to the neighboring cells, there is dazzling. The antidazzle drain 7 plays its role perfectly during the accumulation phase but is quite inoperative during the reading phase.

For example, if a cell 10 of the reading register 3 can receive a charge $Q_{2SAT}$ 1.2 times greater than the charge $Q_{1SAT}$ and if the accumulation time is 3 milliseconds and the reading time 10 microseconds, then an over illumination equal to 75 times the saturation illumination of the photosensitive element causes saturation of cell 10 and consequently creates dazzling.

FIG. 3 shows a block diagram of one embodiment of a known type of linear image sensor associated with the antidazzle device of the invention. The linear image sensor includes a row 21 of photosensitive elements 28. Each photosensitive element 28 is associated with an antidazzle drain 27 and with a reading register 22 or 23, through a gate 29. The cells 28 of even rank are associated with a cell of an even reading register 23. The photosensitive elements 28 of uneven rank are associated with a cell of an uneven reading register 22. The reading registers 22 and 23 each have a series output connected to a conversion capacitor 24. This latter has an output connected to an input of a preamplifier 25 delivering a video signal to an output terminal 26 of the image sensor.

An electron network, not shown, controls gates 29 and reading registers 22 and 23. Control means 30 deliver to this network control signals $\phi_P$, $\phi_{L1}$, and $\phi_{L2}$ identical to those of the above described embodiment. The operation of elements 21 to 29 is quite identical to that of elements 1 to 9 of the embodiment shown in FIG. 1 and described above. The embodiment shown in FIG. 3 further includes an auxiliary uneven register 40 associated with the uneven reading register 22; an even auxiliary register 41, associated with the even reading registers 23; a drain 42 connected to a series output of register 40 and a drain 43 connected to a series output of register 41; and gates, not shown in FIG. 3, connecting the cells of reading registers 22 and 23 respectively to the cells of the auxiliary registers 40 and 41. These gates are controlled by an electrode network 20 receiving a control signal $\phi_{GP}$. The auxiliary registers 40 and 41 are controlled by the same signals $\phi_{L1}$ and $\phi_{L2}$ as the reading registers 22 and 23. The control means 30, of conventional construction, further deliver the control signal $\phi_{GP}$ which is described further on.

FIG. 4a shows a schematical cross section of this embodiment. The insulating elements situated under the electrodes are not shown for the sake of clarity. They are formed of silica. This Figure shows: a photosensitive element 28 associated with an antidazzle MOS transistor 27; a gate 29; a cell of the even reading register 23; a cell of the even auxiliary register 41; and an electrode belonging to the electrode network 20 and forming a connecting gate between these two cells.

The photosensitive element 29 is formed of an N doped zone 37 in a P type silicon substrate 32. The anti-dazzle transistor 27 is formed of an electrode 39 brought to a constant potential $V_G$ and a drain formed of an N doped zone 36 implanted in substrate 32, and brought to a constant potential VDA whose algebraic value is greater than $V_G$. Gate 29 is formed by an electrode 34 over a substrate zone 32, not having any implantation.

The reading register 23 and the auxiliary register 41 each have a charge transfer channel formed by the same N doped zone 38 implanted in substrate 32. These two channels are separated by a potential barrier having a level which varies depending on the value of the control signal $\phi_{GP}$ applied to electrode 44. An electrode 33 is disposed over the cell of reading register 23 and an electrode 45 is disposed over the cell of auxiliary register 41. Both receive the control signal $\phi_{L1}$ in this example. The adjacent cells, not shown in FIG. 4a, in register 23 and in register 41 have disposed thereover electrodes similar to electrodes 33 and 45 and also receiving the control signal $\phi_{L1}$. The cells of register 23 are separated from their neighbours by gates, not shown, formed by electrodes receiving the control signal $\phi_{L2}$ phase shifted with respect to the signal $\phi_{L1}$, during the phase for transferring charges from one cell to another. The same goes for the cells of register 41.

FIG. 4d shows a timing diagram of the signals $\phi_{L1}$, $\phi_{L2}$, $\phi_P$, $\phi_{GP}$ during the phase for transferring charges into the register and the phase for shifting charges into the reading register and the auxiliary register. The potentials are referenced with respect to a vertical axis oriented from top to bottom as in the preceding figures.

It should be noted that, in this embodiment, the auxiliary register 41 is similar to the reading register 23. These two registers may be manufactured simultaneously because their transfer channels are formed by the same zone 38 in which an N type material is implanted and because electrodes 34 and 45 may be deposited simultaneously. With respect to the manufacture of a conventional image sensor, it is only necessary to complete the control means 30 for producing the control signal GP, described further on, and to add an additional polycrystalline silicon level for forming the electrode 44 of the transfer gates between the cells of register 23 and register 41. The same goes for registers 22 and 40.

FIG. 4b shows a diagram of the potentials in the space of this section, during the phase for accumulating charges in the limit sensor. As in the conventional sensor, light 36 releases charges which are accumulated in the photosensitive element 28. If the illumination is very great and saturates the photosensitive element, charges overflow and pass over the potential barrier $V_G$ created by the electrode 39 and are attracted by the potential VDA of drain 36. They cannot overflow on the reading register 23 side for electrode 34 of the passage gate receives a signal $\phi_P$ having a potential $V_{P1}$ whose algebraic value is less than $V_G$. The control signal GP has a potential $V_{R1}$ close to potential $V_{P1}$ during the accumulation phase. These two potentials may be zero.

FIG. 4c shows a diagram of the potentials in the space of the section shown in FIG. 3, during the reading phase. The control signal $\phi_P$ assumes a potential value $V_{P2}$ greater than $V_{P1}$ and greater than $V_G$, which makes it possible for the charges accumulated in the photosensitive element 28 to pass into the cell of register 23. During the time taken for reading the photosensitive element 28, the light 35 continues to release charges 31 which are added to the charges accumulated during the accumulation phase. If the overillumination is very high, the total charge transferred into the cell of register 23 may be greater than the amount $Q_{3SAT}$ required for saturating this cell and could cause overflow of the charges towards the neighbouring cells. But, during the transfer of charges to register 23, the control signal GP takes on a potential value $V_{R2}$ greater than $V_{R1}$ and greater than the algebraic value of the potential corresponding to the storage of a charge $Q_{3SAT}$ in the cell of register 23. Consequently, a part of the charges tending to saturate the cell of register 23 pass over the potential barrier of level $V_{R2}$ and go into the cell of register 41.

As shown in FIG. 4d, during the phase when charges are transferred into the reading registers, the signal $\phi_{L1}$ remains at a constant level equal to its greatest potential value, and the signal $\phi_{L2}$ remains at a constant level equal to its lowest potential value, for isolating the cells of the reading register and for isolating the cells of the auxiliary register by attracting the charges under electrodes 33 and 45. The signal $\phi_P$ takes on its maximum potential value $V_{P2}$ then shortly afterwards, the signal GP takes on its maximum potential value $V_{R2}$. They keep these maximum values for a time slightly less than the time during which $\phi_{L1}$ and $\phi_{L2}$ remain at a constant level. Just before the charge shift phase, the signal $\phi_P$ takes on again its value $V_{P1}$ for isolating the photosensitive element 28 from register 23 and, shortly afterwards, the control signal GP takes on again the value $V_{R1}$ for isolating the registers 23 and 41. Then the control $\phi_{L1}$ and $\phi_{L2}$ change values alternately for shifting the charges inside registers 23 and 41. The charges then contained in register 23 are shifted from cell to cell until they reach the conversion capacity 24, whereas the charges contained in the cells of the auxiliary register 41 are shifted to drain 43 from whence they are removed. The signals $\phi_{L1}$, $\phi_{L2}$, $\phi_P$ are the same as for a conventional image sensor with biphase control signals. It is within the scope of a man skilled in the art to modify the conventional control means for further delivering the signal GP.

The maximum overillumination acceptable by this device is all the greater the wider the auxiliary registers 40 and 41. Dazzle in the image sensor device occurs when the amount of charges delivered by the photosensitive element 28 reaches a value equal to the sum of the charge amounts corresponding respectively to saturation of a cell of register 23 and to saturation of a cell of register 41.

For example, if the charge amounts corresponding to saturation of the auxiliary register 41 is equal to twice the charge amount $Q_{3SAT}$ corresponding to saturation of register 23, that is to say if the width of register 41 is equal to twice the width of register 3, and if $Q_{3SAT}$ is equal to 1.25 times the charge amount $Q_{1SAT}$ corresponding to saturation of a photosensitive element, then calculation shows that the overillumination may reach 825 times the saturation illumination of the photosensitive element 28, without dazzle for an accumulation time of 3 ms and a reading time of 10 microseconds.

Generally, the supportable overillumination N is given by the formula:

$$N = \left(\frac{Q_{2SAT}}{Q_{1SAT}} - 1\right) \cdot \frac{T_i}{T_L}$$

where $Q_{2SAT}$ is the charge amount corresponding to saturation of the photosensitive element, $T_i$ is the accumulation time and $T_L$ the reading time.

The antidazzle device of the invention then makes it possible for an image sensor to withstand, without dazzle, over illumination very much greater than that withstood by an image sensor only having a known antidazzle drain and without adding noise to the video signal.

FIG. 5a shows a schematical section f a second embodiment of an image sensor with an antidazzle device of the invention. This second embodiment differs from the first one by the structure of the channels of the reading register and of the auxiliary registers. The other elements are identical and in FIG. 5 bear the same references as in FIG. 4a. The reading registers 22 and 23 each have a transfer channel formed of a zone 49 in which an N+ type material is implanted in the P type silicon substrate 32. The auxiliary registers 40 and 41 each have a transfer channel formed of a zone 50 in which an N++ type material is implanted in the substrate 32. Each cell of the reading register 23 has thereover an electrode 33 and each cell of register 41 has thereover an electrode 45 connected to the electrode 33 of the corresponding cell of register 23, as in the first embodiment. Each cell of register 23 is connected to a cell of register 41 by a gate formed of an electrode 44 controlled by the control signal GP and this electrode 44 is situated above the frontier common to zones 49 and 50. The control signals are the same as in the first embodiment.

FIG. 5b shows a diagram of the potentials in the space of the section shown in FIG. 5a, during the phase when charges accumulate in the photosensitive element 28. The doping difference between the transfer channel of register 41 and the transfer channel of register 23 means that the channel of register 41 is at a potential whose algebraic value is appreciably greater than that of the channel of register 23. During the phase of accumulation of charges in the photosensitive element 28, the operation is unchanged with respect to the first embodiment and with respect to the operation of the conventional image sensor having an antidazzle transistor.

FIG. 5c shows a diagram of the potentials in the space of the section shown in FIG. 5a, during phase for reading the charges accumulated in the photosensitive element 28. With the control signal $\phi_P$ assuming a potential value $V_{P2}$ greater than $V_{P1}$ the accumulator charges are transferred to register 23 as well as charges 31 released by the light 35 during this reading phase. The control signal GP has a potential value $V_{R2}$ greater than the potential value corresponding to the charge $Q_{3SAT}$ for which the cell of register 2 is saturated and for which the charges might overflow to neighbouring cells.

The excess charges, when high illumination occurs, pass then over the potential barrier of level $V_{R2}$ and descend into the cell of register 41. Then the control GP again takes on the potential value $V_{R1}$ for again isolating register 23 and register 41 after signal $\phi_P$ has closed gate 29, as before. Then the charges are shifted from one cell to another in register 23 as far as conversion capacity 24 and the excess charges, situated in the cells of register 41, are shifted from one cell to another as far as drain 43.

Because of the potential difference between the transfer channel of register 41 and the transfer channel of register 23, a charge excess can only descend the potential lines from register 23 to register 41 and can never rise up these lines and cause an overflow from one cell of register 23 to a neighbouring cell, whatever the value of the overillumination.

This second embodiment of the antidazzle device of the invention further extends, practically definitively, the maximum value of the overillumination possible without dazzle, with respect to the first example, it requires an additional manufacturing step for implanting the N++ doped zone 50.

The auxiliary register associated with each reading register for forming an antidazzle device of the invention takes up a not inconsiderable amount of space which is not a disadvantage for a linear type image sensor but which is not so readily compatible with matrix type image sensors. However, there exist matrix type image sensors in which it is quite possible to incorporate an antidazzle device of the invention. This is particularly the case for a device called CHARGE SWEEP DEVICE described in the review MITSUBISHI ELECTRONIC ADVANCE page 20, December 1985.

A block diagram of this matrix type image sensor is shown in FIG. 6. It includes a matrix of photodiodes 61, each photodiode being connected by a gate 62 to a vertical transfer device 63. Each vertical transfer device 63 has at one end a storage device 67 and a gate 68. In this device, the lines of the matrix are selected and read successively and not simultaneously. For a time corresponding to one line, the gates 62 of a single line are opened under the control of a device 64 sweeping the transfer gates, and each vertical transfer device 63 transports the charges delivered by a single photodiode 61, under the control of a device 66 for sweeping the transfer devices which causes displacement of a potential barrier 65 in each vertical transfer device 63.

The entire length of a vertical transfer device 63 is available for transporting the charges of a single photodiode 61, consequently the transfer capacity of this vertical transfer device 63 is large, even though it is constructed with a very small channel width. The charges transported by each device 63 are accumulated in a storage device 67 and then are transmitted to a cell of the reading register 69. This latter is a conventional charge transfer register, collecting the charges corresponding to an image line and transferring them to a preamplifier 70 which delivers a video signal to an output terminal 71. Control means 72 deliver phase shifted control signals $\phi_{L1}$ and $\phi_{L2}$ for controlling the shift of the charges in the reading register 69, and a control signal $\phi_P$ for controlling the gates 68. These latter are opened during the transfer time into the vertical transfer devices 63.

FIG. 7 shows the block diagram of one embodiment of this type of image sensor associated with an antidazzle device of the invention. This embodiment includes, in addition to the above described elements, an auxiliary register 73 coupled to the reading register 69 by gates, not shown, controlled by a common electrode 75 receiving a control signal GP delivered by an additional output of the control drain 72. The signals $\phi_P$, $\phi_{L1}$, $\phi_{L2}$ and GP are similar to those described above. A series output of the auxiliary register 73 is connected to a drain register 74 for removing the excess charges transferred from the reading register 69 to the auxiliary register 73 under the action of signal GP, then shifted to the series output under the action of the control signals $\phi_{L1}$ and $\phi_{L2}$ which are the same as for the control of the reading register 69. As for the embodiments described above, the reading register 69 and the auxiliary register 73 may be formed by the same N doped implantation or else by two different implantations doped respectively N+ or N++.

The invention is not limited to the examples described above, it may be applied to image sensors having single phase, biphase, triphase or quadriphase charge transfer reading registers. It may also be applied to registers having an enrichment channel or an impoverishment channel.

It is applicable to all the image sensors having at least one charge transfer reading register, particularly in the field of television cameras.

What is claimed is:

1. An antidazzle device for a charge transfer image sensor, this sensor including:
   at least one assembly of photosensitive elements in which charges are released by light;
   antidazzle drains coupled respectively to each photosensitive element for draining away excess charges released during a phase for accumulating charges in the photosensitive elements,
   at least one charge transfer reading register coupled to each photosensitive element assembly, the charges released in each photosensitive element assembly being transferred to this register then shifted by this register to a series output thereof;
   and an auxiliary register coupled to each reading register and similar thereto, for collecting excess charges released by the light during the time during which charges are transferred from the photosensitive elements to a reading register, and then for shifting them towards a drain.

2. The device as claimed in claim 1, wherein each cell of said reading register is coupled to a cell of a respective auxiliary register by means of a gate which creates a low potential barrier during transfer of the charges from a photosensitive assembly to said reading register; and a high potential barrier during shifting of the charges within said reading register and within said auxiliary register.

3. The device as claimed in claim 1, wherein said reading register and said auxiliary register respectively comprise channels, and wherein said channels are formed by a same doping zone.

4. The device as claimed in claim 1, wherein said reading register and said auxiliary register respectively comprise channels, and wherein the channel of each auxiliary register is formed by a doping zone different from the doping zone forming the channel of the reading register to which it is coupled, so that the excess charges collected in said auxiliary register cannot transfer back into an associated reading register.

* * * * *